United States Patent
Wu et al.

(10) Patent No.: US 10,630,308 B2
(45) Date of Patent: Apr. 21, 2020

(54) ANALOG-TO-DIGITAL CONVERTER WITH LOW INTER-SYMBOL INTERFERENCE AND REDUCED COMMON-MODE VOLTAGE MISMATCH

(71) Applicant: REALTEK SEMICONDUCTOR CORPORATION, Hsinchu (TW)

(72) Inventors: Ying-Cheng Wu, Hsinchu County (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/383,731

(22) Filed: Apr. 15, 2019

(65) Prior Publication Data
US 2020/0028518 A1 Jan. 23, 2020

(30) Foreign Application Priority Data
Jul. 20, 2018 (TW) .............................. 107125066 A

(51) Int. Cl.
H03M 1/38 (2006.01)
H03M 1/44 (2006.01)
H03K 5/24 (2006.01)

(52) U.S. Cl.
CPC .............. *H03M 1/442* (2013.01); *H03K 5/24* (2013.01)

(58) Field of Classification Search
CPC ................................. H03M 1/442; H03K 5/24
USPC .................................................. 341/122, 155
See application file for complete search history.

(56) References Cited

U.S. PATENT DOCUMENTS

| | | | |
|---|---|---|---|
| 6,653,966 B1 | 11/2003 | van der Goes et al. | |
| 6,784,824 B1* | 8/2004 | Quinn | ....................... G06G 7/14 341/120 |
| 7,903,017 B2 | 3/2011 | Hsieh et al. | |
| 2004/0246163 A1* | 12/2004 | Leung | ................. H03M 1/1057 341/172 |
| 2011/0234441 A1* | 9/2011 | Makihara | ............ H03M 1/1225 341/172 |

FOREIGN PATENT DOCUMENTS

TW 201105043 A1 2/2011

OTHER PUBLICATIONS

Byung-Geun Lee et al., "A 10-bit 50 MSs Pipelined ADC With Capacitor-Sharing and Variable-gn Opamp ", Mar. 2009, pp. 883-890, vol. 44, No. 3, IEEE Journal of Solid-State Circuits.

(Continued)

*Primary Examiner* — Peguy Jean Pierre
(74) *Attorney, Agent, or Firm* — WPAT, PC

(57) ABSTRACT

The present invention discloses an analog-to-digital converter (ADC) including an analog circuit, a first switch, a second switch, a first capacitor, and a second capacitor. The analog circuit has a first input terminal and a second input terminal and is configured to amplify and/or compare signals on the first input terminal and the second input terminal. One end of the first capacitor is coupled to the first input terminal, and the other end receives an input voltage via the first switch. One end of the second capacitor is coupled to the first input terminal, and the other end receives a reference voltage via the second switch.

10 Claims, 7 Drawing Sheets

(56) References Cited

OTHER PUBLICATIONS

Naga Sasidhar et al., "A Low Power Pipelined ADC Using Capacitor and Opamp Sharing Technique With a Scheme to Cancel the Effect of Signal Dependent Kickback", Sep. 2009, pp. 2392-2401, vol. 44, No. 9, IEEE Journal of Solid-State Circuits.
OA letter of counterpart TW application of application No. 107125066 dated Nov. 28, 2018. Summary of the OA letter: (1) Claim 1 is anticipated by reference 1(TW 201105043 A1). (2) Reference 1(TW 201105043 A1) renders Claims 8-10 obvious.

* cited by examiner

ANALOG-TO-DIGITAL CONVERTER WITH LOW INTER-SYMBOL INTERFERENCE AND REDUCED COMMON-MODE VOLTAGE MISMATCH

BACKGROUND OF THE INVENTION

1. Field of the Invention

The present invention relates to analog-to-digital converters (ADCs).

2. Description of Related Art

FIG. 1 is a circuit diagram of a conventional ADC. The ADC 100 includes a comparator 110, a capacitor $C_p$, a capacitor $C_n$, and switches S1$a$, S2$a$, S3$a$, S1$b$, S2$b$, and S3$b$. The ADC 100 operates alternately between the first phase and the second phase according to two non-overlapping clocks $\Phi_1$ and $\Phi_2$ (as shown in FIG. 2). If the circuit acts or becomes active (e.g., turning on switches) at high levels of the clock, then the first phase would be the high level periods of one of the two non-overlapping clocks, the second phase would be the high level periods of the other clock, and "non-overlapping" means that the two clocks are not high at the same time. The clocks $\Phi_1$ and $\Phi_2$ have non-overlapping intervals—between time points t1 and t2 and between time points t1' and t2'. Even if the falling edge of the clock $\Phi_1$ is substantially aligned with the rising edge of the clock $\Phi_2$ (i.e., t1=t2) and the rising edge of the clock $\Phi_1$ is substantially aligned with the falling edge of the clock $\Phi_2$ (i.e., t1'=t2'), the clocks $\Phi_1$ and $\Phi_2$ are still non-overlapping clocks.

Reference is made back to FIG. 1. The input voltage $V_{in+}$ and the input voltage $V_{in-}$ are differential voltages inputted to the ADC 100, and the voltages $V_{th+}$, $V_{th-}$, and $V_{b2}$ are reference voltages. When the clock $\Phi_1$ is high, the switches S1$a$, S3$a$, S1$b$, and S3$b$ are turned on and the switches S2$a$ and S2$b$ are turned off, so that the capacitor $C_p$ and the capacitor $C_n$ respectively sample the input voltage $V_{in+}$ and the input voltage $V_{in-}$. When the clock $\Phi_2$ is high, the switches S2$a$ and S2$b$ are turned on and the switches S1$a$, S3$a$, S1$b$, and S3$b$ are turned off, so that signal addition or subtraction is carried out through conversions of voltages on the capacitors $C_p$ and $C_n$. The comparator 110 compares and/or amplifies the signals on the two input terminals of the comparator 110 when the clock $\Phi_2$ is high, and accordingly generates the output signals $V_{out+}$ and $V_{out-}$. The output signals $V_{out+}$ and $V_{out-}$ are the outcome of analog-to-digital conversion of the input voltages ($V_{in+}$ and $V_{in-}$).

Since one end of the capacitor $C_p$ (or $C_n$) alternately receives the input voltage $V_{in+}$ (or $V_{in-}$) and the reference voltage $V_{th+}$ (or $V_{th-}$), inter-symbol interference (ISI) is likely to occur. (That is, the reference voltage $V_{th}$ affects the sampling of the input voltage $V_{in}$ in the subsequent phase). Moreover, when the common-mode voltage of the reference voltage $V_{th}$ is different from the common-mode voltage of the input voltage $V_{in}$, the ADC 100 is highly unstable.

SUMMARY OF THE INVENTION

In view of the issues of the prior art, an object of the present invention is to provide an analog-to-digital converter (ADC) to reduce inter-symbol interference (ISI) and to avoid circuit instability caused by mismatching common-mode voltages, so as to make an improvement to the prior art.

An ADC is provided. The ADC includes an analog circuit, a first switch, a second switch, a first capacitor, and a second capacitor. The analog circuit has a first input terminal and a second input terminal and is configured to amplify and/or compare signals on the first input terminal and the second input terminal. An end of the first capacitor is coupled to the first input terminal, and the other end of the first capacitor receives an input voltage through the first switch. An end of the second capacitor is coupled to the first input terminal, and the other end of the second capacitor receives a reference voltage through the second switch.

An ADC is also provided. The ADC includes an analog circuit, a first switch, a second switch, a third switch, a fourth switch, a first capacitor, and a second capacitor. The analog circuit has a first input terminal and a second input terminal and is configured to amplify and/or compare signals on the first input terminal and the second input terminal. An end of the first capacitor is coupled to the first input terminal, and the other end of the first capacitor receives an input voltage through the first switch or receives a first reference voltage through the third switch. An end of the second capacitor is coupled to the first input terminal, and the other end of the second capacitor receives a second reference voltage through the second switch or receives a third reference voltage through the fourth switch.

Compared with the conventional technology, the ADC of the present invention can reduce ISI and improve stability.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes analog-to-digital converters (ADCs). On account of that some or all elements of the ADC could be known, the detail of such elements is omitted provided that such detail has little to do with the features of this disclosure and this omission nowhere dissatisfies the specification and enablement requirements. A person having ordinary skill in the art can choose components equivalent to those described in this specification to carry out the present invention, which means that the scope of this invention is not limited to the embodiments in the specification.

In the following description, two ends of a capacitor are defined as a top plate and a bottom plate, respectively; the top plate refers to the end coupled to the comparator or amplifier, whereas the bottom plate refers to the end not coupled to the comparator or amplifier. Such definition is made only for the ease of discussion and not necessarily related to "top" and "bottom" in the actual circuit. The first phase and the second phase can respectively be the high level (or low level) periods of two non-overlapping clocks, or the high level periods and the low level periods of a single clock.

Figure 1:
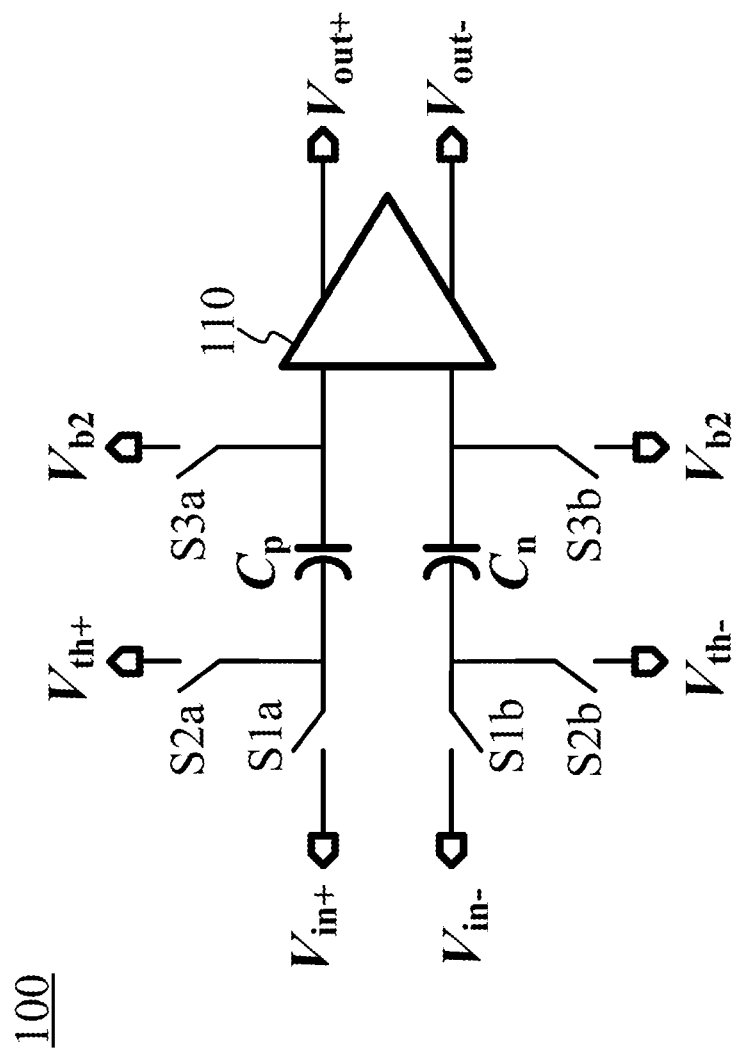
FIG. 1 illustrates a circuit diagram of a conventional ADC.
Figure 2:
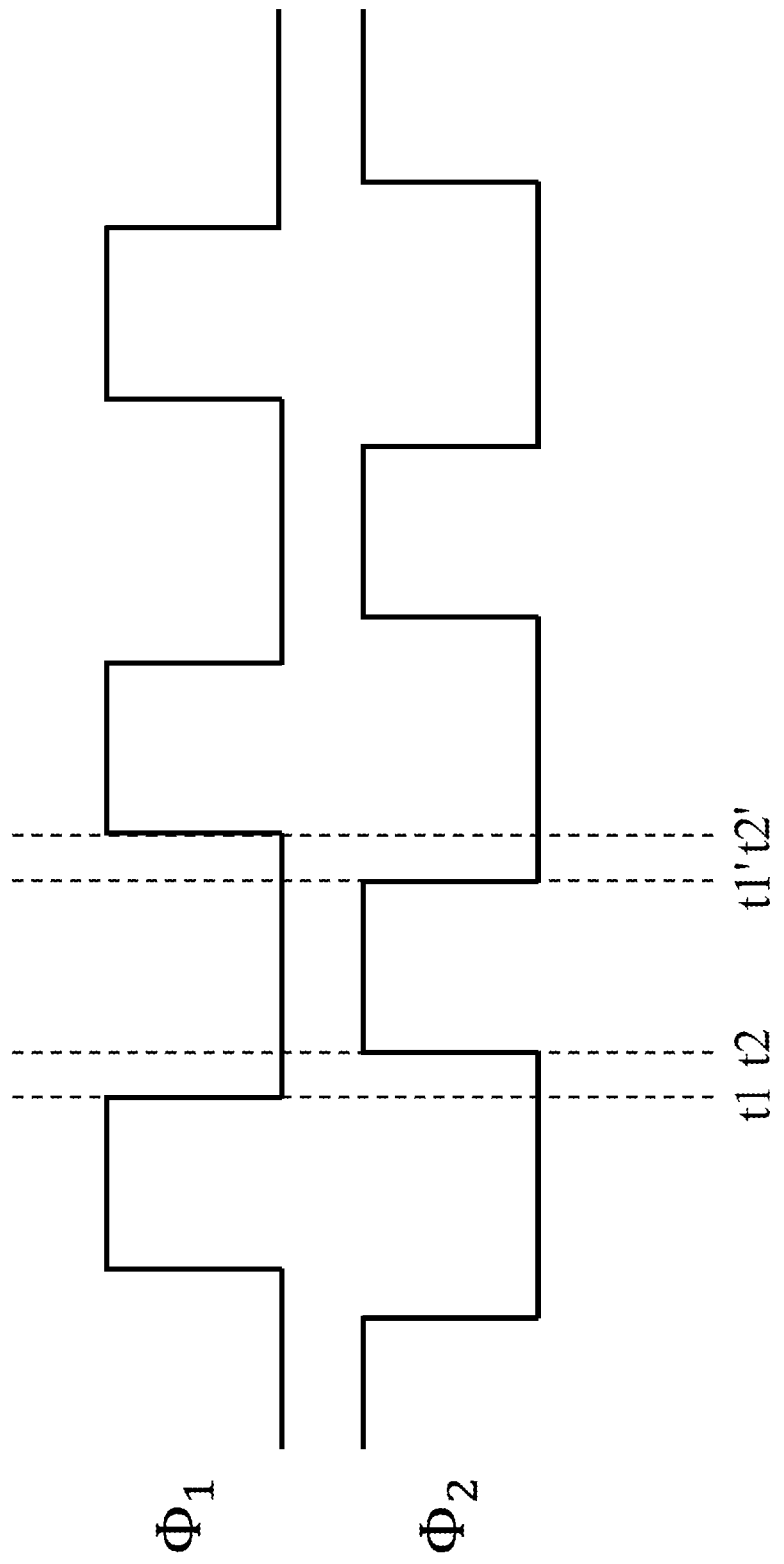
FIG. 2 illustrates two non-overlapping clocks $\Phi_1$ and $\Phi_2$.
Figure 3:
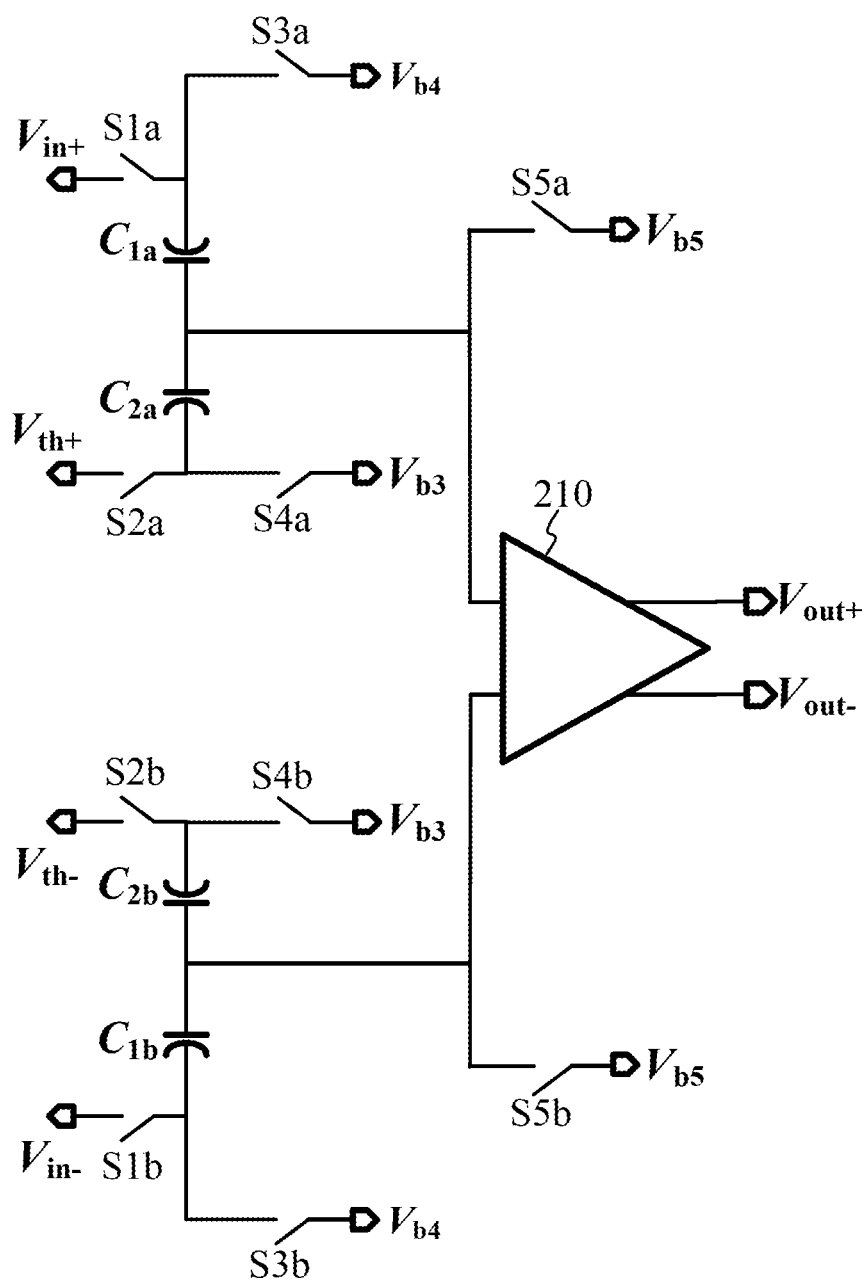
FIG. 3 illustrates a circuit diagram of an ADC according to an embodiment of the present invention.

FIG. 3 is a circuit diagram of an ADC according to an embodiment of the present invention. The ADC 200 includes an analog circuit 210, capacitors $C_{1a}$, $C_{2a}$, $C_{1b}$, $C_{2b}$, and switches S1a, S2a, S3a, S4a, S5a, S1b, S2b, S3b, S4b, S5b. The analog circuit 210 has two input terminals and two output terminals and amplifies and/or compares the signals on the two input terminals. The analog circuit 210 can be an amplifier (e.g., an operational amplifier), a comparator, or a combination of an amplifier and a comparator (e.g., first amplifying and then comparing the signals). Employing an amplifier and/or comparator to implement the ADC is well known to those of ordinary skill in the art, and the details are thus omitted for brevity. The ADC 200 operates alternately between the first phase and the second phase.

The capacitor $C_{1a}$ and the capacitor $C_{2a}$ are coupled to one of the input terminals of the analog circuit 210. The capacitor $C_{1b}$ and the capacitor $C_{2b}$ are coupled to the other input terminal of the analog circuit 210. In some embodiments, the upper plates of capacitors $C_{1a}$, $C_{2a}$, $C_{1b}$, $C_{2b}$ are directly coupled (electrically connected) to the analog circuit 210 (as shown in FIG. 3).

The input voltages $V_{in+}$ and $V_{in-}$ are differential signals inputted to the ADC 200 and generally vary with time. The reference voltages $V_{th+}$ and $V_{th-}$ are substantially constant (i.e., DC biases), and $V_{th+}$ is not equal to $V_{th-}$. The input voltage $V_{in+}$ is not equal to the reference voltage $V_{th+}$, and the input voltage $V_{in-}$ is not equal to the reference voltage $V_{th-}$. The reference voltages $V_{b3}$, $V_{b4}$, and $V_{b5}$ are also substantially constant, and there is no limitation to the relationship among the three reference voltages. In some embodiments, when the reference voltages $V_{th+}$ and $V_{th-}$ are interchanged, the digital code outputted by the ADC 200 is inverted (i.e., from a logic 0 to a logic 1, or vice versa), that is, the output signal $V_{out+}$ and the output signal $V_{out-}$ are interchanged.

In some embodiments, the capacitance value of the capacitor $C_{1a}$ and the capacitance value of the capacitor $C_{2a}$ may be equal or unequal, and the capacitance value of the capacitor $C_{1b}$ and the capacitance value of the capacitor $C_{2b}$ may be equal or unequal. The capacitance value of the capacitor $C_{1a}$ is substantially the same as the capacitance value of the capacitor $C_{1b}$, and the capacitance value of the capacitor $C_{2a}$ is substantially the same as the capacitance value of the capacitor $C_{2b}$.

The ADC 200 samples the input voltage $V_{in+}$ (or $V_{in-}$) and the reference voltage $V_{th+}$ (or $V_{th-}$) with two capacitors $C_{1a}$ and $C_{2a}$ (or $C_{1b}$ and $C_{2b}$), respectively; in this way, the input voltage $V_{in+}$ (or $V_{in-}$) and the reference voltage $V_{th+}$ (or $V_{th-}$) does not interfere with each other. Therefore, the inter-symbol interference (ISI) issue that the conventional ADC faces can be solved. Furthermore, the ADC 200 can compensate for the difference between the common-mode voltage of the input voltage $V_{in+}$ (or $V_{in-}$) and the common-mode voltage of the reference voltage $V_{th+}$ (or $V_{th-}$) by adjusting the voltages $V_{b3}$ and $V_{b4}$, to thereby improve the stability of the circuit. For example, if the common-mode voltage of the input voltage $V_{in+}$ (or $V_{in-}$) is greater than the common-mode voltage of the reference voltage $V_{th+}$ (or $V_{th-}$) by 0.2 volts, then $V_{b4}$ can be designed to be greater than $V_{b3}$ by 0.2 volts.

The ADC 200 has two operation methods. The following description focuses on one input terminal of the analog circuit 210. However, those skilled in the art can certainly know the operations for the other input terminal of the analog circuit 210 after reading the following descriptions.

Operation Method One:

In the first phase, the switches S1a, S2a, S5a are turned on, and the switches S3a, S4a are turned off. In other words, in the first phase, the upper plate of the capacitor $C_{1a}$ is coupled or electrically connected to the input terminal of the analog circuit 210 and receives the reference voltage $V_{b5}$, the bottom plate of the capacitor $C_{1a}$ receives the input voltage $V_{in+}$, the upper plate of the capacitor $C_{2a}$ is coupled or electrically connected to the input terminal of the analog circuit 210 and receives the reference voltage $V_{b5}$, and the bottom plate of the capacitor $C_{2a}$ receives the reference voltage $V_{th+}$. Accordingly, in the first phase, the capacitor $C_{1a}$ samples the input voltage $V_{in+}$, and the capacitor $C_{2a}$ samples the reference voltage $V_{th+}$.

In the second phase, the switches S3a, S4a are turned on, and the switches S1a, S2a, S5a are turned off. In other words, in the second phase, the upper plate of the capacitor $C_{1a}$ is coupled or electrically connected to the input terminal of the analog circuit 210, the bottom plate of the capacitor $C_{1a}$ receives the reference voltage $V_{b4}$, the upper plate of the capacitor $C_{2a}$ is coupled or electrically connected to the input terminal of the analog circuit 210, and the bottom plate of the capacitor $C_{2a}$ receives the reference voltage $V_{b3}$.

As the ADC 200 switches from the first phase to the second phase, the terminal voltages of the capacitors $C_{1a}$ and $C_{2a}$ change; in this way, the ADC 200 carries out the addition or subtraction of the signals (i.e., the input voltage $V_{in+}$ and the reference voltage $V_{th+}$). The analog circuit 210 amplifies and/or compares the signals on its two input terminals in the second phase.

Operation Method Two:

In the first phase, the switches S3a, S4a, S5a are turned on, and the switches S1a, S2a are turned off. In other words, in the first phase, the upper plate of the capacitor $C_{1a}$ is coupled or electrically connected to the input terminal of the analog circuit 210 and receives the reference voltage $V_{b5}$, the bottom plate of the capacitor $C_{1a}$ receives the reference voltage $V_{b4}$, the upper plate of the capacitor $C_{2a}$ is coupled or electrically connected to the input terminal of the analog circuit 210 and receives the reference voltage $V_{b5}$, and the bottom plate of the capacitor $C_{2a}$ receives the reference voltage $V_{b3}$. In the first phase, the upper and bottom plates of the capacitor $C_{1a}$ and the upper and bottom plates of the capacitor $C_{2a}$ are in a reset state.

In the second phase, the switches S1a, S2a are turned on, and the switches S3a, S4a, S5a are turned off. In other words, in the second phase, the upper plate of the capacitor $C_{1a}$ is coupled or electrically connected to the input terminal of the analog circuit 210, the bottom plate of the capacitor $C_{1a}$ receives the input voltage $V_{in+}$, the upper plate of the capacitor $C_{2a}$ is coupled or electrically connected to the input terminal of the analog circuit 210, and the bottom plate of the capacitor $C_{2a}$ receives the reference voltage $V_{th+}$. The analog circuit 210 amplifies and/or compares the signals on its two input terminals in the second phase.

Similar to the operation method one, as the ADC 200 switches from the first phase to the second phase, the terminal voltages of the capacitors $C_{1a}$ and $C_{2a}$ change; in this way, the ADC 200 carries out the addition or subtraction of the signals (i.e., the input voltage $V_{in+}$ and the reference voltage $V_{th+}$). The analog circuit 210 amplifies and/or compares the signals on its two input terminals in the second phase.

Figure 4:
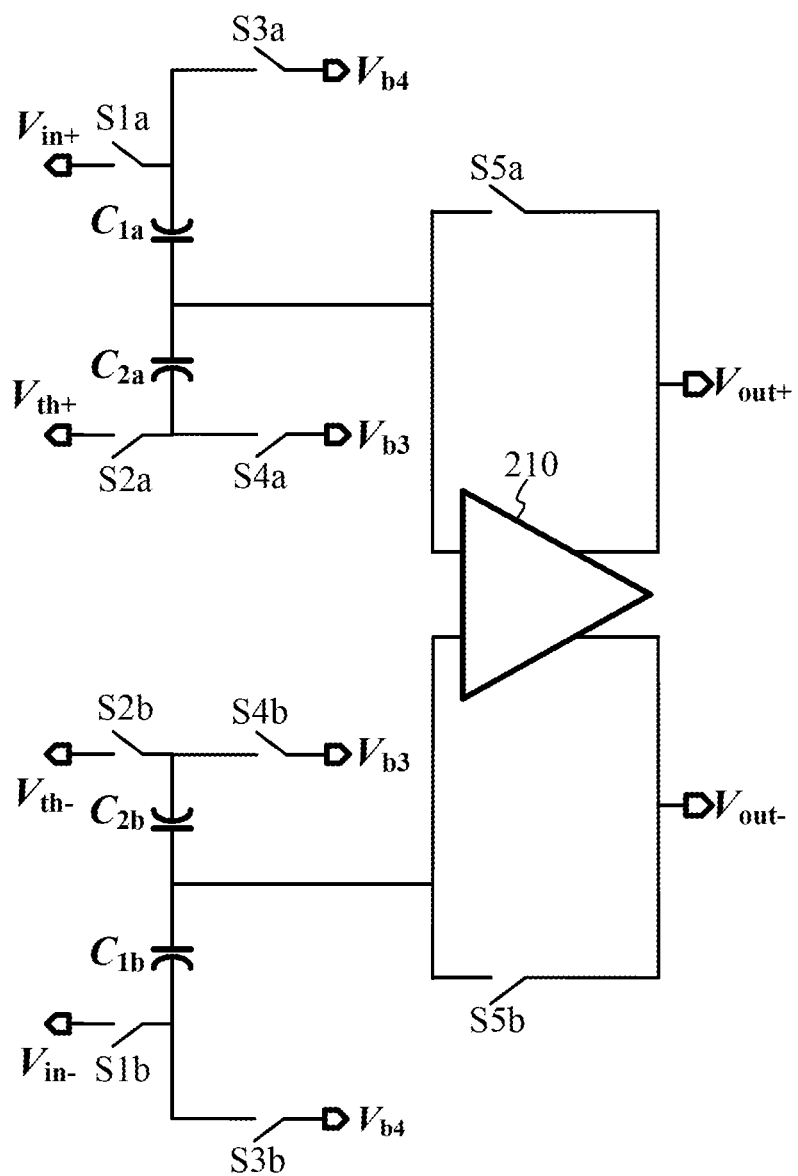
FIG. 4 illustrates a circuit diagram of an ADC according to another embodiment of the present invention.

FIG. 4 is a circuit diagram of an ADC according to another embodiment of the present invention. The ADC 300 is similar to the ADC 200, except that the ADC 300 replaces the reference voltage $V_{b5}$ with the output signal $V_{out+}/V_{out-}$ of the analog circuit 210. As a result, a reference voltage can be saved, which makes the circuit of the ADC 300 simpler than that of the ADC 200. In general, the analog circuit 210 resets in the first phase, which makes the output signal $V_{out+}$ substantially equal to the output signal $V_{out-}$ in the first phase.

Figure 5:
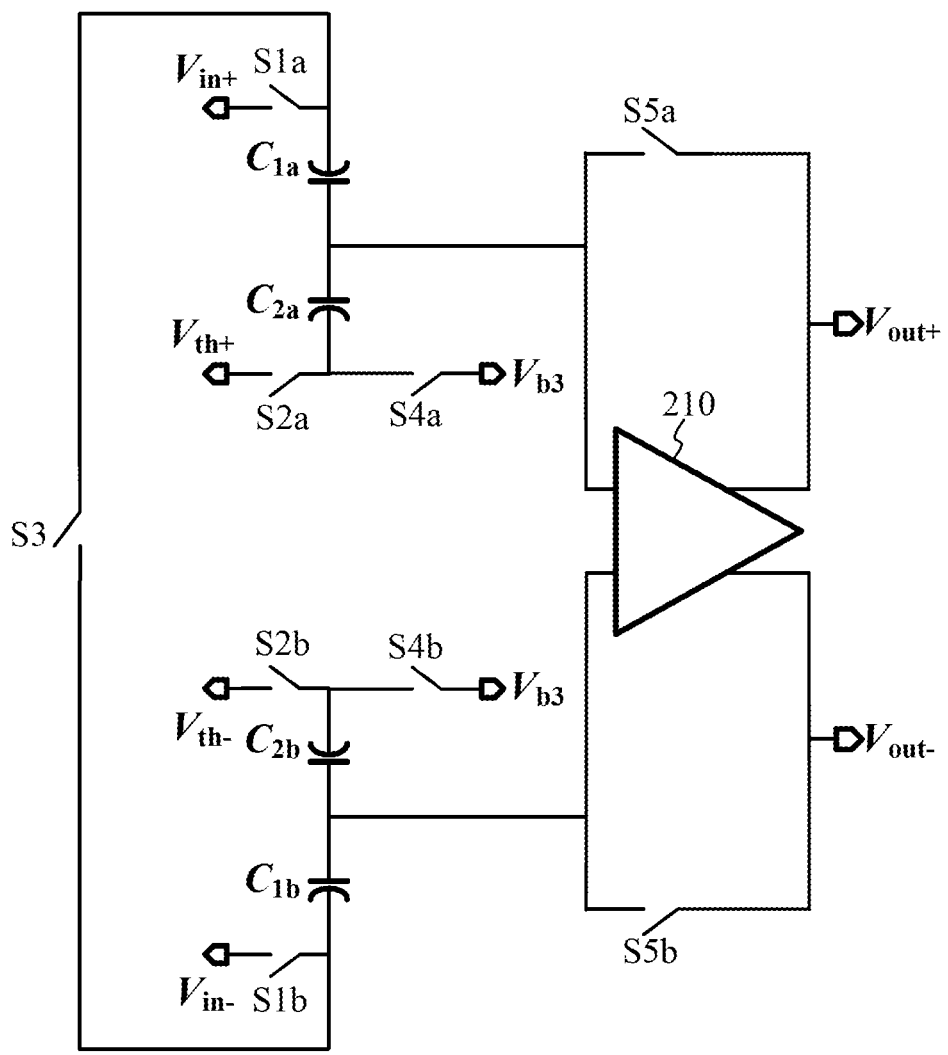
FIG. 5 illustrates a circuit diagram of an ADC according to another embodiment of the present invention.

FIG. 5 is a circuit diagram of an ADC according to another embodiment of the present invention. The ADC 400 is similar to the ADC 300, except that in the ADC 400 the bottom plate of the capacitor $C_{1a}$ and the bottom plate of the capacitor $C_{1b}$ do not receive (or are not coupled to) the reference voltage $V_{b4}$ in the second phase; instead, they are electrically connected to each other through the switch S3. In other words, the switch S3 is coupled between the capacitor $C_{1a}$ and the capacitor $C_{1b}$; more specifically, the switch S3 is coupled between the bottom plate of the capacitor $C_{1a}$ and the bottom plate of the capacitor $C_{1b}$. The time point at which the switch S3 of the ADC 400 is turned on is the same as the time point at which the switches S3a and S3b of the ADC 200 are turned on.

In the embodiment of FIG. 5, when the switch S3 is turned on, the bottom plate of the capacitor $C_{1a}$ and the bottom plate of the capacitor $C_{1b}$ are electrically connected and floating, which means, in this instance, the two bottom plates (which, individually or collectively, can be seen as a node through which the capacitors $C_{1a}$ and $C_{1b}$ are electrically connected) are not coupled or electrically connected to any voltage (including ground) provided from the inside or outside of the chip in which the ADC 400 resides. Because the bottom plate of the capacitor $C_{1a}$ and the bottom plate of the capacitor $C_{1b}$ are electrically connected and floating when the switch S3 is turned on, the voltage on the bottom plate of the capacitor $C_{1a}$, which in this instance is the voltage on the bottom plate of the capacitor $C_{1b}$, is the common-mode voltage of the input voltage and the input voltage $V_{in-}$ when the switch S3 is turned on. The ADC 400 has at least the following advantages: (1) a reference voltage is saved compared to the ADC 300 (i.e., $V_{b4}$ of FIG. 4); and (2) the offset in the common-mode voltage on a capacitor's upper plate can be avoided. This offset is caused by the occurrence that the common-mode voltage on the capacitor's bottom plate in the first phase is not equal to the common-mode voltage on the same plate in the second phase. This occurrence is usually seen in a conventional circuit, in which the common-mode voltage of the input voltage $V_{in+}$ (or $V_{in-}$) is very likely to be different from the common-mode voltage of the reference voltage $V_{th+}$ (or $V_{th-}$).

Figure 6:
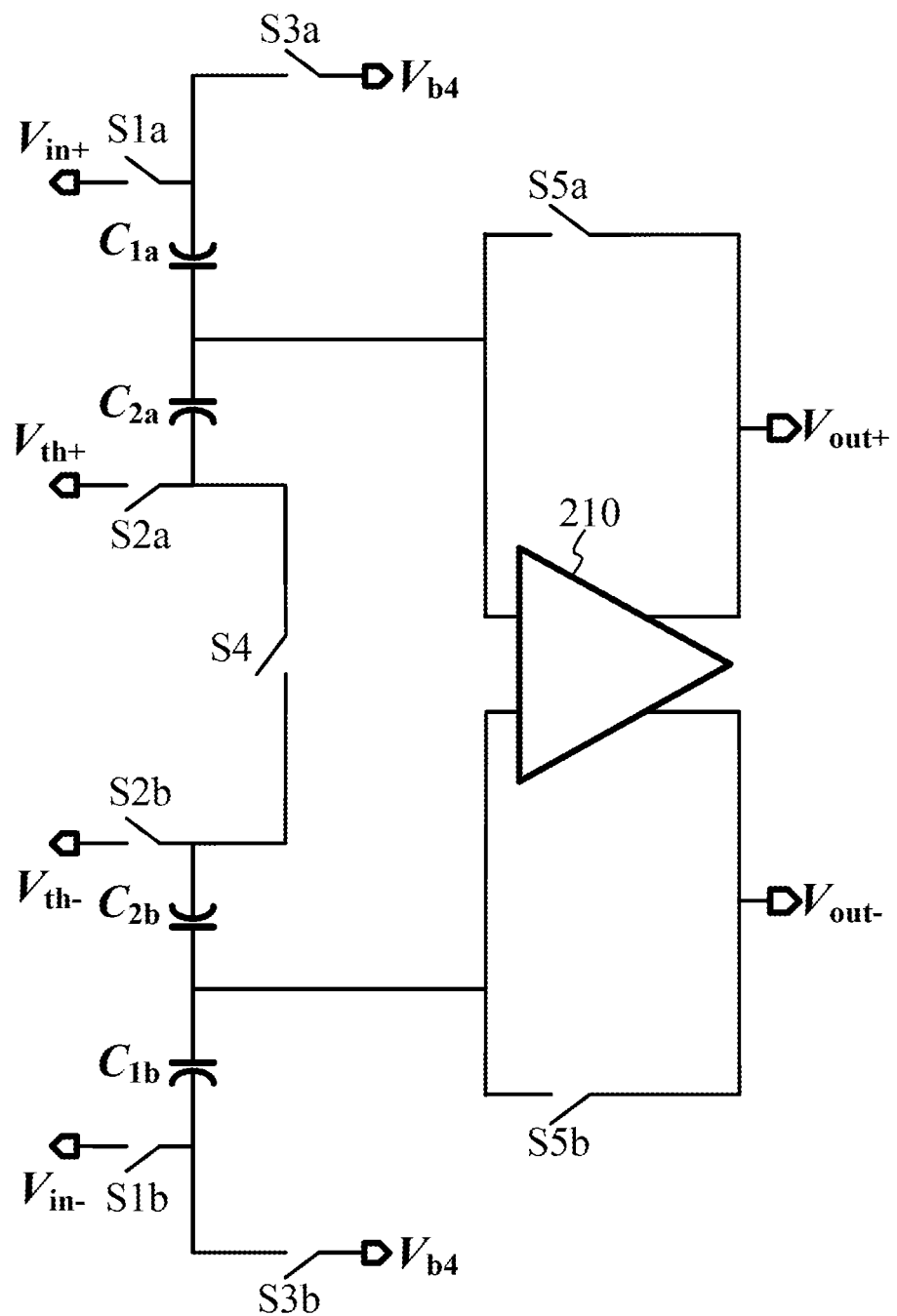
FIG. 6 illustrates a circuit diagram of an ADC according to another embodiment of the present invention.

FIG. 6 is a circuit diagram of an ADC according to another embodiment of the present invention. The ADC 500 is similar to the ADC 300, except that in the ADC 500 the bottom plate of the capacitor $C_{2a}$ and the bottom plate of the capacitor $C_{2b}$ do not receive (or are not coupled to) the reference voltage $V_{b3}$ in the second phase; instead, they are electrically connected to each other through the switch S4. In other words, the switch S4 is coupled between the capacitor $C_{2a}$ and the capacitor $C_{2b}$; more specifically, the switch S4 is coupled between the bottom plate of the capacitor $C_{2a}$ and the bottom plate of the capacitor $C_{2b}$. The time point at which the switch S4 of the ADC 500 is turned on is the same as the time point at which the switches S4a and S4b of the ADC 200 are turned on.

In the embodiment of FIG. 6, when the switch S4 is turned on, the bottom plate of the capacitor $C_{2a}$ and the bottom plate of the capacitor $C_{2b}$ are electrically connected and floating, which means, in this instance, the two bottom plates (which, individually or collectively, can be seen as a node through which the capacitors $C_{2a}$ and $C_{2b}$ are electrically connected) are not coupled or electrically connected to any voltage (including ground) provided from the inside or outside of the chip in which the ADC 500 resides. Because the bottom plate of the capacitor $C_{2a}$ and the bottom plate of the capacitor $C_{2b}$ are electrically connected and floating when the switch S4 is turned on, the voltage on the bottom plate of the capacitor $C_{2a}$, which in this instance is the voltage on the bottom plate of the capacitor $C_{2b}$, is the common-mode voltage of the reference voltage $V_{th+}$ and the reference voltage $V_{th-}$ when the switch S4 is turned on. The ADC 500 has at least the following advantages: (1) a reference voltage is saved compared to the ADC 300 (i.e., $V_{b3}$ of FIG. 4); and (2) the offset in the common-mode voltage on a capacitor's upper plate can be avoided. This offset is caused by the occurrence that the common-mode voltage on the capacitor's bottom plate in the first phase is not equal to the common-mode voltage on the same plate in the second phase.

Figure 7:
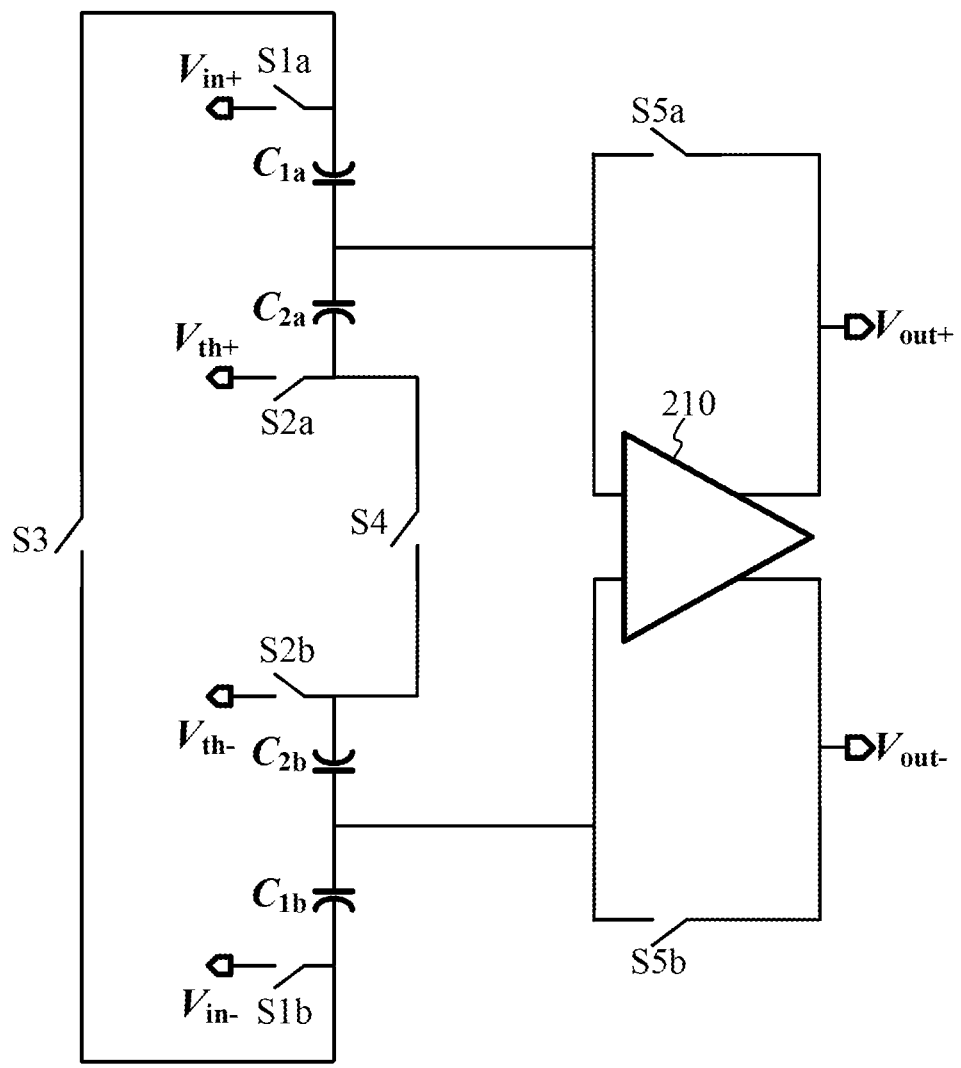
FIG. 7 illustrates a circuit diagram of an ADC according to another embodiment of the present invention.

FIG. 7 is a circuit diagram of an ADC according to another embodiment of the present invention. ADC 600 is a combination of the ADC 400 and the ADC 500. In other words, compared to ADC 300, two reference voltages are saved in ADC 600, which can further reduce the likelihood of the offset in the common-mode voltage on the capacitor's upper plate (i.e., on the input terminal of the analog circuit 210).

The ADCs 200 to 600 are each a one-bit ADC. A multi-bit ADC can be realized by serially connecting multiple aforementioned ADCs (200, 300, 400, 500 or 600) and designing the reference voltages $V_{th+}$ and $V_{th-}$ properly. For example, a two-bit ADC is realized by serially connecting three one-bit ADCs, a three-bit ADC is realized by serially connecting seven one-bit ADCs, and so on.

Since a person having ordinary skill in the art can appreciate the implementation detail and the modification thereto of the present method invention through the disclosure of the device invention, repeated and redundant description is thus omitted. Furthermore, the shape, size, and ratio of any element and the step sequence of any flow chart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An analog-to-digital converter (ADC) comprising:
an analog circuit having a first input terminal and a second input terminal and configured to amplify and/or compare signals on the first input terminal and the second input terminal;
a first switch;
a second switch;
a third switch;
a fourth switch;
a first capacitor, wherein an end of the first capacitor is coupled to the first input terminal, and other end of the first capacitor receives a first input voltage through the first switch;
a second capacitor, wherein an end of the second capacitor is coupled to the first input terminal, and other end of the second capacitor receives a first reference voltage through the second switch;
a third capacitor, wherein an end of the third capacitor is coupled to the second input terminal, and other end of the third capacitor receives a second input voltage through the third switch;
a fourth capacitor, wherein an end of the fourth capacitor is coupled to the second input terminal, and other end of the fourth capacitor receives a second reference voltage through the fourth switch, the second reference voltage being different from the first reference voltage; and
a fifth switch coupled between the first capacitor and the third capacitor, wherein the first capacitor and the third capacitor are electrically connected when the fifth switch is turned on.

2. The ADC of claim 1, wherein when the fifth switch is turned on, a node through which the first capacitor and the third capacitor are electrically connected is floating and not coupled or electrically connected to any voltage.

3. The ADC of claim 1, wherein a capacitance value of the first capacitor is substantially the same as a capacitance value of the third capacitor, and a capacitance value of the second capacitor is substantially the same as a capacitance value of the fourth capacitor.

4. The ADC of claim 1 further comprising:
a sixth switch coupled between the second capacitor and the fourth capacitor, wherein the second capacitor and the fourth capacitor are electrically connected when the sixth switch is turned on.

5. The ADC of claim 4, wherein when the sixth switch is turned on, a node through which the second capacitor and the fourth capacitor are electrically connected is floating and not coupled or electrically connected to any voltage.

6. An analog-to-digital converter (ADC) comprising:
an analog circuit having a first input terminal and a second input terminal and configured to amplify and/or compare signals on the first input terminal and the second input terminal;
a first switch;
a second switch;
a third switch;
a fourth switch;
a fifth switch;
a sixth switch;
a seventh switch;
an eighth switch;
a first capacitor, wherein an end of the first capacitor is coupled to the first input terminal, and other end of the first capacitor receives a first input voltage through the first switch or receives a first reference voltage through the third switch;
a second capacitor, wherein an end of the second capacitor is coupled to the first input terminal, and other end of the second capacitor receives a second reference voltage through the second switch or receives a third reference voltage through the fourth switch
a third capacitor, wherein an end of the third capacitor is coupled to the second input terminal, and other end of the third capacitor receives a second input voltage through the fifth switch or receives the first reference voltage through the seventh switch; and
a fourth capacitor, wherein an end of the fourth capacitor is coupled to the second input terminal, and other end of the fourth capacitor receives a fourth reference voltage through the sixth switch or receives the third reference voltage through the eighth switch.

7. The ADC of claim 6, wherein a capacitance value of the first capacitor is substantially the same as a capacitance value of the third capacitor, and a capacitance value of the second capacitor is substantially the same as a capacitance value of the fourth capacitor.

8. An analog-to-digital converter (ADC) comprising:
an analog circuit having a first input terminal and a second input terminal and configured to amplify and/or compare signals on the first input terminal and the second input terminal;
a first switch;
a second switch;
a third switch;
a fourth switch;
a first capacitor, wherein an end of the first capacitor is coupled to the first input terminal, and other end of the first capacitor receives a first input voltage through the first switch;
a second capacitor, wherein an end of the second capacitor is coupled to the first input terminal, and other end of the second capacitor receives a first reference voltage through the second switch;
a third capacitor, wherein an end of the third capacitor is coupled to the second input terminal, and other end of the third capacitor receives a second input voltage through the third switch;
a fourth capacitor, wherein an end of the fourth capacitor is coupled to the second input terminal, and other end of the fourth capacitor receives a second reference voltage through the fourth switch, the second reference voltage being different from the first reference voltage; and
a fifth switch coupled between the second capacitor and the fourth capacitor, wherein the second capacitor and the fourth capacitor are electrically connected when the fifth switch is turned on.

9. The ADC of claim 8, wherein when the fifth switch is turned on, a node through which the second capacitor and the fourth capacitor are electrically connected is floating and not coupled or electrically connected to any voltage.

10. The ADC of claim 8, wherein a capacitance value of the first capacitor is substantially the same as a capacitance value of the third capacitor, and a capacitance value of the second capacitor is substantially the same as a capacitance value of the fourth capacitor.

* * * * *